United States Patent
Soeda

(10) Patent No.: US 8,344,587 B2
(45) Date of Patent: Jan. 1, 2013

(54) CAPACITIVE ELECTRO-MECHANICAL TRANSDUCER, AND FABRICATION METHOD OF THE SAME

(75) Inventor: Yasuhiro Soeda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 311 days.

(21) Appl. No.: 12/774,492

(22) Filed: May 5, 2010

(65) Prior Publication Data

US 2010/0283354 A1 Nov. 11, 2010

(30) Foreign Application Priority Data

May 8, 2009 (JP) .................................. 2009-113105

(51) Int. Cl.
*H02K 19/00* (2006.01)

(52) U.S. Cl. ....................................... 310/309; 310/324

(58) Field of Classification Search .................. 310/300, 310/317, 309, 324; 367/181
See application file for complete search history.

(56) References Cited

U.S. PATENT DOCUMENTS

| | | | |
|---|---|---|---|
| 5,452,268 A * | 9/1995 | Bernstein ...................... | 367/181 |
| 5,982,709 A | 11/1999 | Ladabaum | |
| 6,655,011 B1 * | 12/2003 | Kornrumpf et al. ............ | 29/622 |
| 7,359,286 B2 * | 4/2008 | Stuart Savoia et al. ....... | 367/181 |
| 7,589,455 B2 * | 9/2009 | Adachi et al. ................. | 310/335 |
| 7,701,110 B2 | 4/2010 | Fukuda et al. | |
| 7,728,490 B2 * | 6/2010 | Adachi et al. ................. | 310/334 |
| 7,775,979 B2 * | 8/2010 | Thomenius et al. .......... | 600/437 |
| 7,860,258 B2 * | 12/2010 | Azuma et al. ................. | 381/175 |
| 2002/0057484 A1 * | 5/2002 | Mori ............................. | 359/291 |
| 2007/0164632 A1 * | 7/2007 | Adachi et al. ................. | 310/311 |
| 2007/0258332 A1 * | 11/2007 | Stuart Savoia et al. ....... | 367/181 |
| 2008/0089179 A1 | 4/2008 | Matsumoto | |
| 2008/0089180 A1 | 4/2008 | Matsumoto | |
| 2008/0089181 A1 | 4/2008 | Adachi | |
| 2008/0269614 A1 * | 10/2008 | Adachi et al. ................. | 600/459 |
| 2009/0204004 A1 | 8/2009 | Adachi | |

* cited by examiner

*Primary Examiner* — Thanh Lam
(74) *Attorney, Agent, or Firm* — Canon U.S.A., Inc. IP Division

(57) ABSTRACT

A capacitive electro-mechanical transducer includes a plurality of cavities, a communicating portion for connecting the cavities to each other, and two electrodes sandwiching each of the cavities. The cavities are sealed from outside, and at least a portion of the communicating portion is closed to interrupt the communication between the cavities through the communicating portion.

6 Claims, 4 Drawing Sheets

CAPACITIVE ELECTRO-MECHANICAL TRANSDUCER, AND FABRICATION METHOD OF THE SAME

BACKGROUND OF THE INVENTION

1. Field of the Invention

The present invention relates to a capacitive electro-mechanical transducer, and a fabrication method of the capacitive electro-mechanical transducer.

2. Related Background Art

Conventionally, an ultrasound transducer has been used as the ultrasound probe of the ultrasound medical diagnostic apparatus. The ultrasound transducer is a device for converting an electric signal into an ultrasonic oscillation, or vice versa. In the ultrasound medical diagnostic apparatus, an input electric signal is converted into ultrasound to be transmitted into a living body, and the ultrasound reflected in the living body is received to be converted into the electric signal. As a type of the ultrasound transducer, there is the capacitive electro-mechanical transducer. The capacitive electro-mechanical transducer includes a space or a so-called cavity that is maintained under an approximately evacuated condition, and two electrodes sandwiching the cavity therebetween. One of the electrodes is arranged on a thin film or a so-called membrane, and is movably supported.

At the time of an ultrasound transmitting operation, the electric signal according to the ultrasound is applied between the two electrodes. At this time, the membrane and the electrode disposed thereon generate the ultrasonic oscillation due to electrostatic attractive force acting between the two electrodes. On the other hand, at the time of an ultrasound receiving operation, the membrane and the electrode thereon oscillate due to the ultrasonic oscillation from outside. At this time, a distance between the two electrodes changes according to the oscillation, so that the electric capacitance between the two electrodes changes. This capacitive change is detected as the electric signal. Technologies of the capacitive electro-mechanical transducer are disclosed in U.S. Patent Application No. 2008/089179 A1 and U.S. Pat. No. 5,982,709.

A fabrication method of the capacitive electro-mechanical transducer includes a step of forming a sacrificial layer in the form of a cavity on a substrate, a step of forming a membrane layer on the sacrificial layer, and a step of etching the sacrificial layer to form the cavity. An etching hole in the membrane layer is formed beforehand prior to the step of etching the sacrificial layer to supply an etching liquid from outside. Further, the etching hole in an approximately vacuum ambience is closed after the step of etching the sacrificial layer to seal the cavity from outside.

In the capacitive electro-mechanical transducer described above, a degree of vacuum in the cavity influences transmit output characteristics and receive sensitivity characteristics of ultrasound. Generally, when the degree of vacuum in the cavity decreases and gas or liquid intrudes into the cavity, the damping effect acts on the membrane. Hence, transmit output characteristics and receive sensitivity characteristics vary. Therefore, in such a capacitive electro-mechanical transducer, it is important to maintain the degree of vacuum in the cavity for the stability of device characteristics. Even if the cavity structure is damaged for some reason, a decrease in the degree of vacuum in the cavity is suppressed within a minimum range. In the capacitive electro-mechanical transducer described above, however, adjacent cavities communicate with each other through an etchant flow path or a communicating portion formed for the etching of the sacrificial layer. Consequently, when the membrane or vacuum sealing portion in a portion of the cavities is damaged, a vacuum sealing condition of all the cavities communicating with each other is liable to be affected.

SUMMARY OF THE INVENTION

According to one aspect of the present invention, there is provided a method of fabricating a capacitive electro-mechanical transducer including forming a sacrificial layer for forming a plurality of cavities and a communicating portion between the cavities on a substrate, forming a membrane layer on the sacrificial layer, forming an etching hole for exposing a portion of the sacrificial layer to outside in at least a portion of walls forming the cavities, etching the sacrificial layer through the etching hole to form the cavities and the communicating portion for communicating the cavities with each other, closing the etching hole to seal the cavities from outside, and closing at least a portion of the communicating portion to interrupt the communication between the cavities through the communicating portion.

Further features of the present invention will become apparent from the following description of exemplary embodiments with reference to the attached drawings.

DESCRIPTION OF THE EMBODIMENTS

Figure 1A:
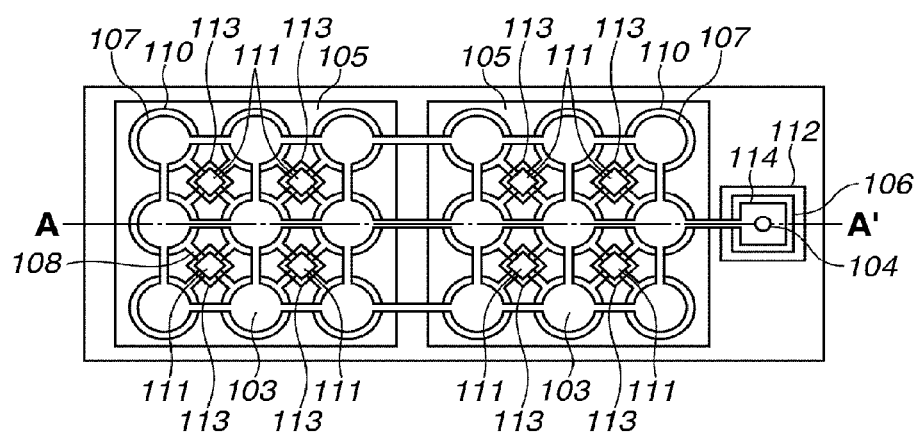
FIG. 1A is a plan view illustrating an embodiment of a capacitive electro-mechanical transducer according to the present invention.

Embodiments of a capacitive electro-mechanical transducer and its fabrication method according to the present invention will hereinafter be described. In the capacitive electro-mechanical transducer and its fabrication method of the present invention, at least a portion of the communicating portion for communicating the cavities with each other to guide an etching liquid or gas at the etching time is closed, and the communication between the cavities is interrupted.

Based on such concept, a fundamental embodiment of the fabrication method of a capacitive electro-mechanical transducer according to the present invention includes a first step of forming a sacrificial layer for forming plural cavities and a communicating portion for communicating the cavities with each other on a substrate with, for example, a lower electrode formed thereon, a second step of forming a membrane layer on the sacrificial layer, and a third step of forming an etching hole for exposing a portion of the sacrificial layer to outside in at least a portion of walls forming the cavities. This portion is located in, for example, the membrane layer on a cavity sacrificial layer corresponding to the cavity or a communicating-portion sacrificial layer corresponding to the communicating portion, the substrate, the lower electrode, or the like. The fabrication method further includes a fourth step of etching the sacrificial layer through the etching hole using the etching liquid or the like to form the cavities and the communicating portion for communicating the cavities with each other, a fifth step of closing the etching hole to seal the cavities from outside, and a sixth step of closing at least a portion of the communicating portion to interrupt the communication between the cavities through the communicating portion.

As described in the embodiment described below, when the etching hole is formed in the membrane layer on the communicating-portion sacrificial layer, the fifth step and the sixth step can be simultaneously performed. In the embodiment described below, the etching hole is formed in the membrane layer on a crossing portion of the communicating-portion sacrificial layers, but the configuration of the communicating-portion sacrificial layer, and the number, configuration and location of the etching hole or holes are not limited those described in the embodiment.

In the present invention, the etching hole has the function of a flow path for bringing the sacrificial layer into contact with an etchant. Accordingly, the etching hole can be formed in at least a portion of walls encompassing the cavity sacrificial layer. Specifically, the etching hole for exposing a portion of the sacrificial layer to outside can be formed in the membrane layer on the cavity sacrificial layer, the membrane layer on the communicating-portion sacrificial layer, the substrate, or the like.

The communicating-portion sacrificial layer can be configured to connect, for example, two cavity sacrificial layers to each other. The etching hole can be single, but the etching rate can be increased when plural etching holes are formed. It is beneficial to form the etching hole in the membrane layer on the communicating-portion sacrificial layer. The reason for that is that the cavity membrane layer is not subjected to etching, and hence characteristics of the device can have aimed values with ease. Further, as described above, the fifth step and the sixth step can be simultaneously performed in this case. Particularly, in this case, the etching rate of the sacrificial layer formed between the electrodes can be made relatively rapid and stable. Hence, productivity of the device can be improved.

As a method for interrupting the communication between the cavities by closing at least a portion of the communicating portion, there is a method of filling a hole formed in at least a portion of the communicating portion and exposed to outside with a material (sealing member). The hole is typically the etching hole, but it can be a hole formed separately from the etching hole. Further, there is a method of interrupting the communication between the cavities by bonding mutually-facing faces of the communicating portion to each other. For example, it is possible to close the communicating portion by bonding mutually-facing upper and lower faces of the communicating portion with an external pressure. This method includes the following examples. A gap between mutually-facing faces of the communicating portion, that is to be closed, is made narrow so that these faces can be bonded to each other with the external pressure. For this purpose, a portion of the sacrificial layer corresponding to this portion is formed into such a shape, and the sacrificial layer is etched.

It is also possible to decrease the thickness of the membrane layer at a portion, that is to be closed, of the communicating portion, and bond faces thereat to each other with the external pressure. Furthermore, there is a method of bringing the membrane layer into contact with the substrate and sidewall with pressure to close a portion of the communicating portion, and hardening the closed portion with a resin. It is also possible to form the membrane layer using a resin, and thermally melt the membrane layer and substrate at a portion, that is to be closed, of the communicating portion to close the communicating portion.

Based on the above-described concept, a fundamental embodiment of the capacitive electro-mechanical transducer of the present invention includes plural cavities, a communicating portion for communicating the cavities with each other, and two electrodes sandwiching the cavity, and the plural cavities are sealed from outside. Further, at least a portion of the communicating portion is closed, and the communication between the cavities connected to the communicating portion is interrupted. The two electrodes are such upper and lower electrodes as described below. An appropriate number of the cavities, whose communication therebetween is interrupted, constitute an element described below, and the capacitive electro-mechanical transducer includes plural elements.

Figure 1B:
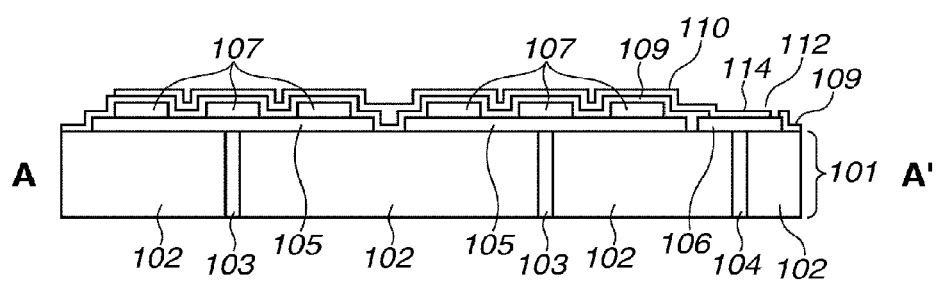
FIG. 1B is an A-A' cross-sectional view of FIG. 1A.

Description will be made of an embodiment of the present invention with reference to the drawings. In a configuration illustrated in FIGS. 1A and 1B, a substrate 101 can be a single crystal silicon substrate, a glass substrate, a glass substrate with penetrating wiring, or the like. When the substrate is a semiconductor substrate such as the single crystal silicon substrate, the substrate can also serve as a lower electrode. In the configuration illustrated in FIGS. 1A and 1B, the glass substrate with penetrating wiring is used. Accordingly, the substrate 101 includes a glass substrate 102, and via wires 103 and 104. A lower electrode 105 illustrated in FIG. 1B is an electrode of a pair of facing electrodes in the capacitive electro-mechanical transducer. The lower electrode 105 is connected to the via wire 103, and drawn to the bottom face side of the substrate 101. An electrode 106 is connected to the via wire 104, and drawn to the bottom face side of the substrate 101. A cavity 107 is a space that is formed between the lower electrode 105 and a membrane 109, and maintained under an approximately evacuated condition. A communicating portion 108 is a space extending from the cavity 107.

The communicating portion 108 acts as a portion for communicating the cavities with each other at the time of etching in a fabrication process of the electro-mechanical converting device described below. The function of the communicating portion 108 is to guide and supply an etching liquid to the cavities. The membrane 109 is a film arranged facing the lower electrode 105 with the cavity 107 interposed therebetween. A space below the membrane 109 is under an approximately evacuated condition as described above, so that the membrane 109 can be movably supported. An upper electrode 110 is formed on the membrane 109, and is movably supported together with the membrane 109. Plural upper electrodes 110 provided on the plural cavities 107 and membranes 109 are mutually electrically connected with each other, and connected to an electrode 114 formed in an opening portion 112. The electrode 114 is electrically connected to the electrode 106.

An etching hole 111 is an opening portion formed in the membrane 109, and acts as a supply path of the etching liquid to be used in the fabrication process of the electro-mechanical converting device. A sealing member 113 is provided in the communicating portion 108, and seals the cavity 107 from an outside space to maintain it under an approximately evacuated condition. Simultaneously, the sealing member 113 closes the communication between the cavities 107 through the communicating portion 108. Details of the etching hole 111 and the sealing member 113 will be described below. The upper electrode 110 can be formed of at least one of metal selected from Al, Cr, Ti, Au, Pt, Cu, Ag, W, Mo, Ta and Ni, and alloy selected from AlSi, AlCu, AlTi, MoW and AlCr. Further, the upper electrode 110 is formed in at least one of the upper face, bottom face and inner portion of the membrane 109. In a case where the membrane is formed of a conductor or semiconductor, the membrane itself can also act as the upper electrode.

In this embodiment of the capacitive electro-mechanical transducer, plural sets of the lower electrodes 105 and penetrating electrodes 103 are electrically insulated from each other. A portion including the plural cavities 107 provided on the lower electrodes 105, that are electrically insulated mutually from each other is called an element. In the ultrasound transmitting operation mode, it is possible to apply electric signals of different waveforms between the lower electrodes 105 and the upper electrodes 110 in different elements, respectively. Accordingly, the transmitting operation in an independent ultrasonic waveform can be performed by each element.

In the ultrasound receive operation mode, a change in the electric capacitance due to the ultrasonic oscillation described above can be detected by each element. Accordingly, the receive operation in an independent ultrasonic waveform can be performed by each element. FIGS. 1A and 1B illustrate the configuration of arrangement in which two elements are disposed in a direction. It is, however, possible to arrange the elements in different manners, i.e., in different number, one or two-dimensional arrangement, or the like. As described above, each element can include plural cavities 107. In this embodiment, each element includes nine cavities 107. The mutual communication between these nine cavities 107 is interrupted.

Description will be made of a fabrication method of the electro-mechanical converting device of this embodiment, and structures of the communicating portion 108, the etching hole 111 and the sealing member 113, with reference to FIGS. 2A to 2K and FIG. 3. FIGS. 2A to 2K illustrate processes of the fabrication method. In FIGS. 2A to 2K, like portions in FIGS. 1A and 1B are designated by like reference numerals. FIGS. 2A to 2G are cross-sectional views, and FIGS. 2H to 2K are plan views.

Figure 2A:
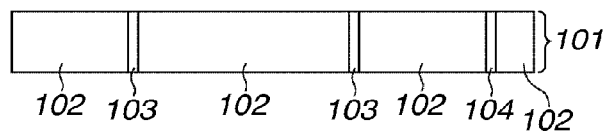
FIGS. 2A to 2K are views illustrating an embodiment of a fabrication method of fabricating a capacitive electro-mechanical transducer according to the present invention.
Figure 2B:
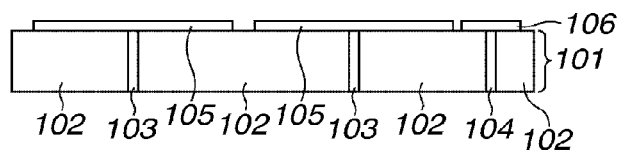

In the fabrication method of this embodiment, the substrate 101 illustrated in FIG. 2A is initially prepared. As described in FIGS. 2B and 2H, the lower electrode 105 is formed. The lower electrode 105 is formed as follows. A metal layer is formed by the vacuum evaporation or sputtering. Thereafter, an etching resist having the same shape as the lower electrodes 105 is formed by the photolithography. Unnecessary portions of the metal layer are removed by the etching to form the lower electrodes 105. The lower electrode 105 can have any shape, and is electrically connected to the via electrode 103. Simultaneously, the electrode 106 connected to the via wire 104 is formed.

Figure 2C:
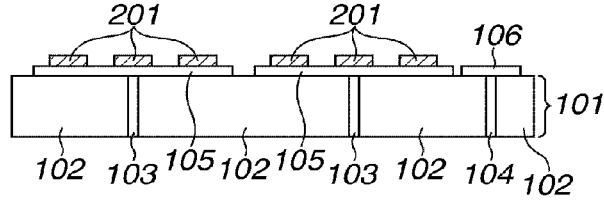
Figure 2D:
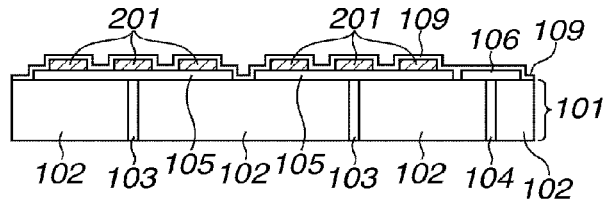
Figure 2E:
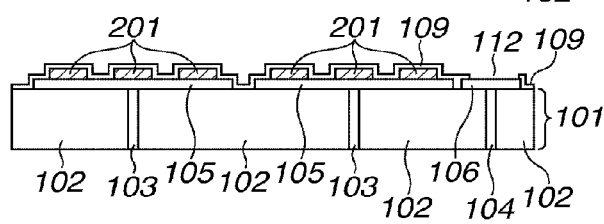
Figure 2F:
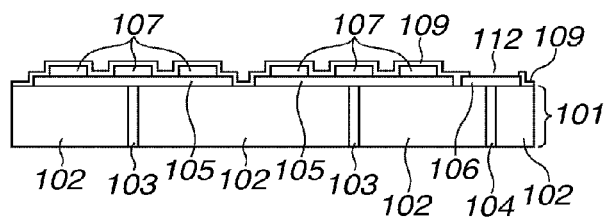
Figure 2G:
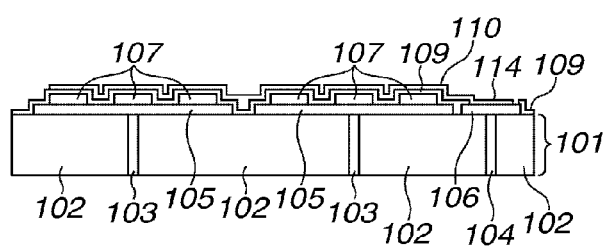
Figure 2H:
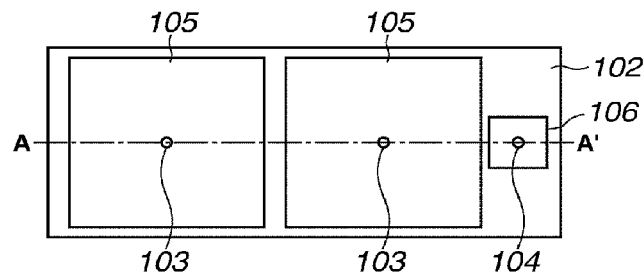
Figure 2I:
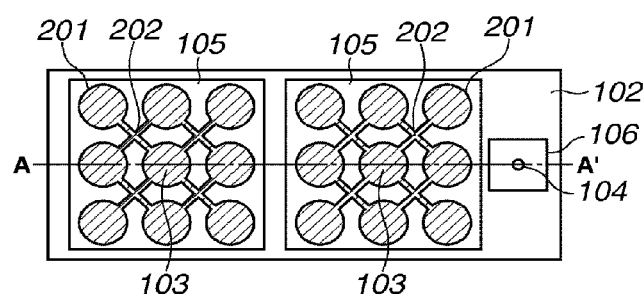

Then, as illustrated in FIGS. 2C and 2I, a cavity sacrificial layer 201 and a communicating-portion sacrificial layer 202 are formed. In a later sacrificial-layer etching step, the cavity sacrificial layer 201 is removed to form the cavity 107. The shape of the cavity 107 is determined by the shape of the cavity sacrificial layer 201. The cavity sacrificial layers 201 are mutually connected to each other through the communicating-portion sacrificial layer 202. The communicating-portion sacrificial layer 202 serves as the supply path of the etching liquid in a step of etching the sacrificial layer. Then, as illustrated in FIG. 2D, the membrane (membrane layer) 109 is formed. The membrane 109 not only movably supports the upper electrode 110, but also electrically insulates the upper electrode 110 from the lower electrode 105. For example, the membrane 109 can be formed of silicon nitride or silicon oxide by the CVD (chemical vapor deposition) method.

Figure 2J:
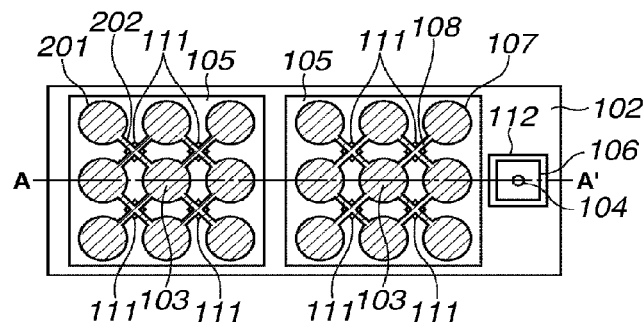

As illustrated in FIGS. 2E and 2J, the etching hole 111 and the opening portion 112 are formed in the membrane 109. The etching hole 111 is formed in the communicating-portion sacrificial layer 202 to supply the etching liquid for etching the sacrificial layer to the communicating-portion sacrificial layer 202 and the cavity sacrificial layer 201. At least one etching hole 111 can be formed in the communicating-portion sacrificial layer 202 or cavity sacrificial layer 201. When plural etching holes 111 are formed as illustrated in FIG. 2J, an etching time of the sacrificial-layer etching step can be shortened. The opening portion 112 is formed by removing the membrane 109 formed on the electrode 106. Through the opening portion 112, the electrode 106 can be electrically connected to the upper electrode 110 that is to be formed in a later step.

The etching hole 111 and the opening portion 112 can be formed in the same step. In this method, after an etching resist is formed by the photolithography, the etching hole 111 and the opening portion 112 are formed by the etching, for example. In a case where the membrane 109 is formed of silicon nitride or silicon oxide, it is beneficial to form the etching hole 111 and the opening portion 112 by the dry etching using plasma.

As illustrated in FIG. 2F, the cavity sacrificial layer 201 is removed by the etching to form the cavity 107. During this etching process, the communicating-portion sacrificial layer 202 can also be removed. The method of etching the sacrificial layer varies in accordance with the material of the cavity sacrificial layer 201. For example, when the cavity sacrificial layer 201 is formed of chromium, it is possible to use the wet etching using an ammonium secondary cerium nitrate. In this case, for example, when the lower electrode 105 is formed of titanium and the membrane 109 is formed of silicon nitride, it is possible to employ the etching selectivity of the cavity sacrificial layer 201 relative to the lower electrode 105 and the membrane 109. The electrolytic etching can also be employed as the etching method.

Figure 2K:
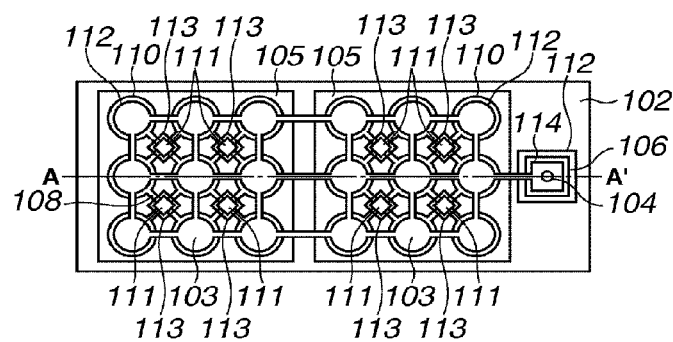

Finally, as illustrated in FIGS. 2G and 2K, the upper electrode 110, the electrode 114 and the sealing member 113 are formed. The upper electrode 110 and the sealing member 113 can be formed of aluminum, for example. In this case, after an aluminum layer is formed by the vacuum evaporation or sputtering and an etching resist with the same shapes as the upper electrode 110, the electrode 114 and the sealing member 112 is formed, unnecessary portions of the metal layer are removed by the etching. The upper electrodes 110 are electrically connected to each other, and connected to the electrode 106 through the electrode 114 formed in the opening portion 112. Thus, the upper electrodes 110 are electrically drawn to the bottom face side of the substrate 101 through the via electrode 104.

Figure 3:
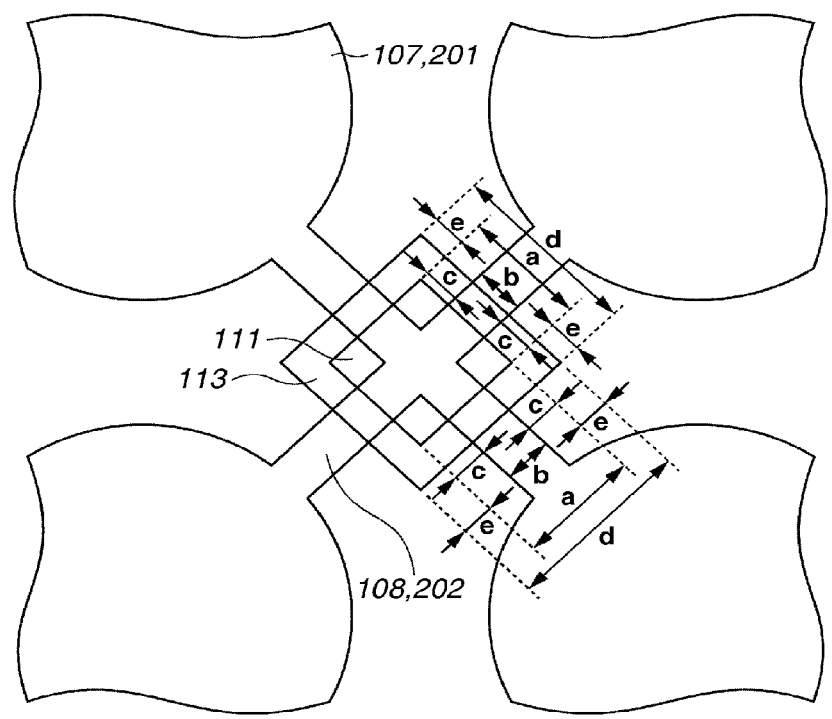
FIG. 3 is an enlarged plan view illustrating a portion of the embodiment of the capacitive electro-mechanical transducer.

Description will be made of configurations of the etching hole 111 and the sealing member 113 in this embodiment, with reference to FIG. 3. In FIG. 3, the upper electrode 110 is omitted. Further, the cavity sacrificial layer 201 is occasionally referred to as the cavity 107 with the same shape. Similarly, the communicating-portion sacrificial layer 202 is occasionally referred to as the communicating portion 108. In this embodiment, the communicating-portion sacrificial layers 202 extend from the etching hole 111 in four directions, and each communicating-portion sacrificial layer 202 is connected to the cavity sacrificial layer 201. Accordingly, during a step of etching the sacrificial layer, the etching simultaneously advances in four directions from the etching hole 111, and the cavity sacrificial layers 201 are etched.

Further, the width (designated by the letter "a" in FIG. 3) of the etching hole 111 is larger than the width (designated by the letter b in FIG. 3) of the communicating-portion sacrificial layer 202. That is, the width "a" is larger than the width b by 2c. The width (designated by the letter d in FIG. 3) of the sealing member 113 is larger than the width (designated by the letter a in FIG. 3) of the etching hole 111. That is, the width d is larger than the width a by 2e. Herein, the communication between the communicating portions 108 extending in four directions from the etching hole 111 is interrupted. When the sealing member 113 is formed under an approximately evacuated ambience, each cavity 107 can be sealed under an approximately evacuated condition in an independent manner. Here, the step of sealing the plural cavities 107 from outside, and the step of interrupting the communication between the cavities 107 through the communicating portions 108 can be simultaneously executed.

In this embodiment, the cavities can be made independent from each other by closing the communicating portion 108 for communicating the cavities with each other. In the etching step, the etching hole common to the plural cavities is formed to efficiently perform the etching and form the cavities. However, the completed cavities are not communicated from each other. Therefore, even if any cavity is damaged, the other cavities are not affected. For example, even if the membrane in a cell is broken, the other cavities are not communicated with the atmosphere.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-113105, filed May 8, 2009, which is hereby incorporated by reference herein in its entirety.

What is claimed is:

1. A method of fabricating a capacitive electro-mechanical transducer, the method comprising:
    forming a sacrificial layer for forming a plurality of cavities and a communicating portion between the cavities on a substrate;
    forming a membrane layer on the sacrificial layer;
    forming an etching hole for exposing a portion of the sacrificial layer;
    etching the sacrificial layer through the etching hole to form the cavities and the communicating portion for communicating the cavities with each other;
    closing the etching hole to seal the cavities from outside; and
    closing at least a portion of the communicating portion to interrupt the communication between the cavities through the communicating portion.

2. The method according to claim 1, wherein the etching hole is formed in the membrane layer on the sacrificial layer for forming the communicating portion, and the closing the etching hole and the closing the portion of the communicating portion are simultaneously performed.

3. The method according to claim 1, wherein in the closing the portion, a hole formed in at least another portion of the communicating portion and exposed to outside is filled with a material to interrupt the communication between the cavities through the communicating portion.

4. The method according to claim 1, wherein in the closing the portion, mutually-facing faces in at least another portion of the communicating portion are bonded to each other to interrupt the communication between the cavities through the communicating portion.

5. A capacitive electro-mechanical transducer comprising:
    a plurality of cavities;
    a communicating portion configured to connect the cavities to each other; and
    two electrodes configured to sandwich each of the cavities,
    wherein, the cavities are sealed from outside, and at least a portion of the communicating portion is closed to interrupt the communication between the cavities through the communicating portion.

6. The capacitive electro-mechanical transducer according to claim 5, wherein the cavities are sealed from outside by sealing the portion of the communicating portion.

* * * * *